US009246408B2

(12) United States Patent
Maeda et al.

(10) Patent No.: US 9,246,408 B2
(45) Date of Patent: Jan. 26, 2016

(54) POWER CONVERSION APPARATUS

(75) Inventors: Ken Maeda, Hitachinaka (JP); Toshiya Satoh, Hitachinaka (JP); Hiroyuki Yamai, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 101 days.

(21) Appl. No.: 14/122,800

(22) PCT Filed: May 22, 2012

(86) PCT No.: PCT/JP2012/063064
§ 371 (c)(1),
(2), (4) Date: Nov. 27, 2013

(87) PCT Pub. No.: WO2012/165226
PCT Pub. Date: Dec. 6, 2012

(65) Prior Publication Data
US 2014/0085955 A1    Mar. 27, 2014

(30) Foreign Application Priority Data

May 31, 2011    (JP) ................................. 2011-121214

(51) Int. Cl.
*H02M 7/537*    (2006.01)
*H02M 7/5387*    (2007.01)
(Continued)

(52) U.S. Cl.
CPC ............ *H02M 7/5387* (2013.01); *H02M 7/003* (2013.01); *H05K 7/1432* (2013.01)

(58) Field of Classification Search
CPC ....... H01L 25/03; H01L 7/537; H01L 7/5387; H01L 7/003; H02M 7/537; H02M 7/5387; H02M 7/003

USPC .......................... 363/123, 131, 132, 144, 147
See application file for complete search history.

(56) References Cited

U.S. PATENT DOCUMENTS 7,974,101 B2 *    7/2011    Azuma et al. ................. 361/760
2007/0109715 A1 *    5/2007    Azuma et al. .............. 361/299.3
(Continued)

FOREIGN PATENT DOCUMENTS

JP    2002-136154 A    5/2002
JP    2009-219270 A    9/2009
(Continued)

OTHER PUBLICATIONS

International Search Report dated Aug. 28, 2012 with English translation (three (3) pages).

*Primary Examiner* — Adolf Berhane
(74) *Attorney, Agent, or Firm* — Crowell & Moring LLP

(57) ABSTRACT

The power conversion apparatus includes an inverter circuit which converts a DC current into an AC current and have a U-phase, V-phase, and w-phase power semiconductor modules, and a capacitor module for smoothing the DC current. Each of the power semiconductor modules is configured separately and connected to a first bus bar. The first bus bar is configured with a first positive side bus bar, a first negative side bus bar, and a first insulation member arranged between the first positive side bus bar and the first negative side bus bar. The first bus bar includes a first to third terminals to which the U-phase, V-phase, and W-phase power semiconductor modules are connected, respectively, and a fourth terminal connected to a terminal of the second bus bar protruding from a surface of sealing material of a second bus bar.

16 Claims, 13 Drawing Sheets

(51) Int. Cl.
*H02M 7/00* (2006.01)
*H05K 7/14* (2006.01)

(56) References Cited

U.S. PATENT DOCUMENTS

| 2008/0198548 | A1* | 8/2008 | Nakamura et al. | 361/689 |
| 2009/0231811 | A1 | 9/2009 | Tokuyama et al. | |
| 2010/0025126 | A1 | 2/2010 | Nakatsu et al. | |
| 2012/0300522 | A1* | 11/2012 | Tokuyama et al. | 363/131 |
| 2013/0021749 | A1* | 1/2013 | Nakajima | 361/689 |
| 2013/0094269 | A1* | 4/2013 | Maeda et al. | 363/141 |
| 2013/0265808 | A1* | 10/2013 | Ishii et al. | 363/97 |
| 2013/0294040 | A1* | 11/2013 | Fukumasu et al. | 361/752 |

FOREIGN PATENT DOCUMENTS

| JP | 2010-35347 A | 2/2010 |
| JP | 2010-199628 A | 9/2010 |
| JP | 2011-67093 A | 3/2011 |
| JP | 2012-253883 A | 12/2012 |
| JP | 2013-143439 A | 7/2013 |

* cited by examiner

POWER CONVERSION APPARATUS

TECHNICAL FIELD

The present invention relates to a power conversion apparatus, particularly, to a power conversion apparatus used for a hybrid vehicle or an electric vehicle.

BACKGROUND ART

Nowadays, a hybrid electric vehicle and an electric vehicle are spreading rapidly, and improvement of assembling productivity and downsizing are required for the power conversion apparatus. Generally, as a method for improving assembling productivity and downsizing, modularization of parts is employed. Modularization is carried out for a power semiconductor module and a smoothing capacitor module as described in Patent Literature 1 (JP 2009-219270 A).

Further downsizing is required for a power conversion apparatus for a vehicle, which increases the effect of heat transfer between modules. Therefore, it is required to lower the heat generation of each module.

CITATION LIST

Patent Literature

PTL1: JP 2009-219270 A

SUMMARY OF INVENTION

Technical Problem

When the heat generation in a bus bar which connects a power semiconductor module and a smoothing capacitor module is reduced, the heat transfer between each module will be reduced. The subject of the present invention is to lower the heat generation and at the same time suppressing a notable increase in a parasitic inductance in a bus bar.

Solution to Problem (1) According to a first aspect of the present invention, a power conversion apparatus includes: a U-phase power semiconductor module including a high side U-phase circuit and a low side U-phase circuit of an inverter circuit which converts a DC current into an AC current; a V-phase power semiconductor module including a high side V-phase circuit and a low side V-phase circuit of the inverter circuit; a W-phase power semiconductor module including a high side W-phase circuit and a low side W-phase circuit of the inverter circuit; and a capacitor module including a capacitor cell which smoothes the DC current, wherein: a first bus bar which is connected to the U-phase, V-phase, and W-phase power semiconductor modules, and the U-phase, V-phase, and W-phase power semiconductor modules are configured separately; the capacitor module includes a case for containing the capacitor cell, a sealing material for sealing the capacitor cell, and a second bus bar which is connected to the capacitor cell in the sealing material, a portion of the second bus bar protruding from a surface of the sealing material; the first bus bar is configured with a first positive side bus bar, a first negative side bus bar, and a first insulation member arranged between the first positive side bus bar and the first negative side bus bar; and the first bus bar further includes a first terminal connected to a terminal extending from the U-phase power semiconductor module, a second terminal connected to a terminal extending from the V-phase power semiconductor module, a third terminal connected to a terminal extending from the W-phase power semiconductor module, and a fourth terminal connected to an end portion of the portion protruding from a surface of the sealing material of the second bus bar.

(2) According to a ninth aspect of the present invention, a power conversion apparatus includes: a U-phase power semiconductor module including a high side U-phase circuit and a low side U-phase circuit of an inverter circuit which converts a DC current into an AC current; a V-phase power semiconductor module including a high side V-phase circuit and a low side V-phase circuit of the inverter circuit; a W-phase power semiconductor module including a high side W-phase circuit and a low side W-phase circuit of the inverter circuit; a capacitor module including a capacitor cell which smoothes the DC current; a first bus bar connected to the U-phase, V-phase, and W-phase power semiconductor modules; and a second bus bar connected to the capacitor cell and the first bus bar, wherein: the capacitor module contains the capacitor cell and the second bus bar in a capacitor module case and is sealed by an insulation sealing material; and a connecting terminal of the second bus bar which is connected to the first bus bar protrudes from a surface of the insulation sealing material.

Advantageous Effects of Invention

By the present invention, the heat transfer in each module of a power conversion apparatus is suppressed and at the same time the heat exchange between the modules is suppressed, thereby enabling downsizing of the power conversion apparatus.

DESCRIPTION OF EMBODIMENTS

An embodiment of the present invention will be described below based on the drawings. An inverter of the embodiment is installed in an electric vehicle of which a motor is an only traction power of the vehicle, or in an electrically driven vehicle such as a hybrid electric vehicle which uses an engine or an internal combustion engine and a motor as a traction power of the vehicle. The inverter is a power conversion apparatus which converts a direct current supplied from a battery or an onboard power source into a three-phase AC power and supplies the three-phase AC power to a motor.

First Embodiment

Figure 1:
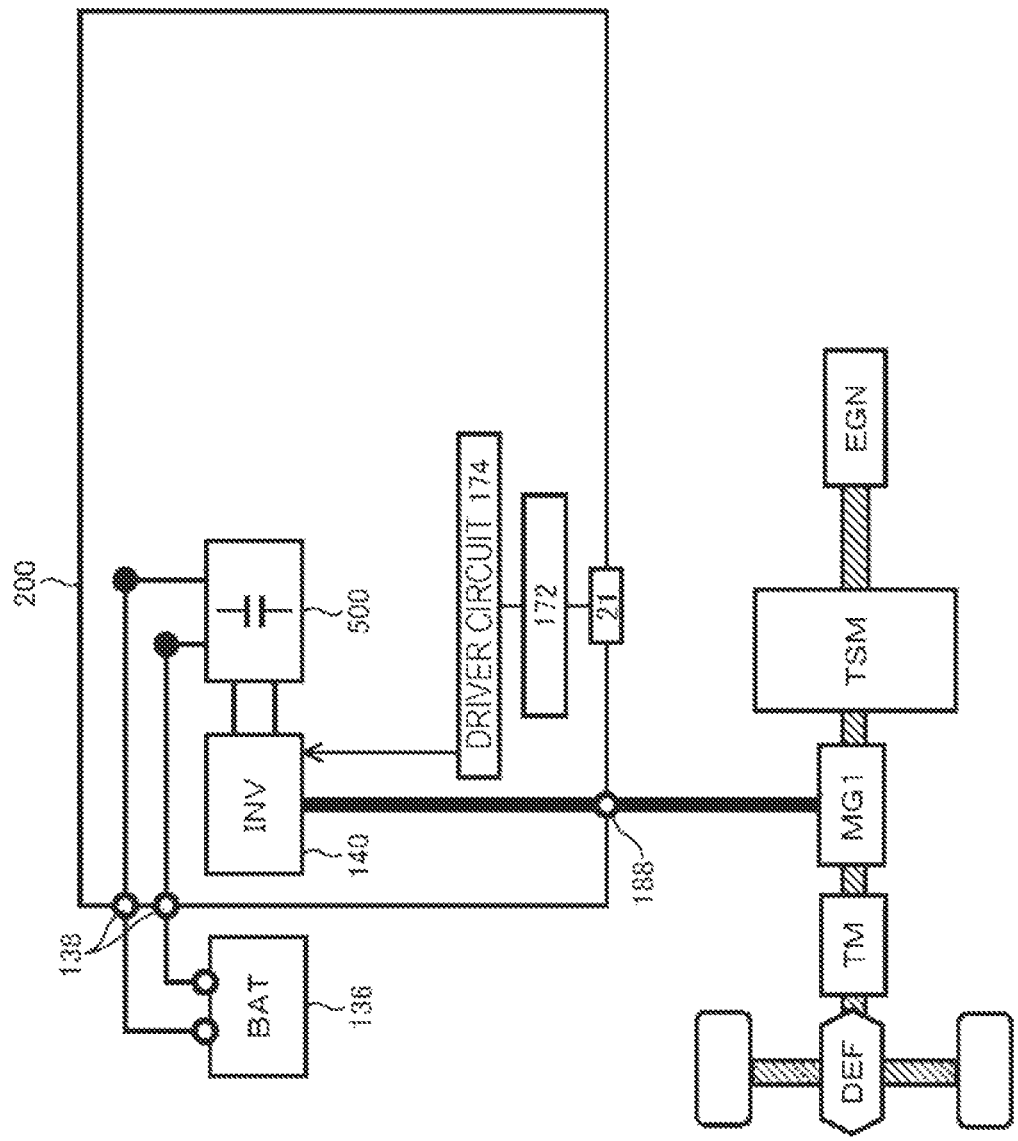
FIG. 1 is a control block diagram of a hybrid vehicle (hereinafter referred to as HEV).

A first embodiment of the power conversion apparatus according to the present invention will be described below in detail referring to the drawings. FIG. 1 is a diagram illustrating a control block of a hybrid vehicle (hereinafter referred to as HEV). An engine EGN and a motor generator MG1 produce a driving torque of the vehicle. The motor generator MG1 not only produces rotational torque but also functions as a generator which converts a mechanical energy input to the motor generator MG1 from outside into a power.

The motor generator MG1 is, for example, a synchronous motor or an induction motor, and operates either as a motor or a generator depending on the way the motor generator is operated as described above. In the case the motor generator MG1 is installed in an automobile, it is desirable that the motor generator MG1 is downsized and produces high power. Therefore, a permanent magnet type synchronous motor using a magnet such as neodymium is suitable. Further, the permanent magnet type synchronous motor is excellent to be used for an automobile in a view point that the heat generation in a rotor is less compared to that of the induction motor.

The output torque in the output side of the engine EGN is transmitted to the motor generator MG1 via a power transfer system TSM. The rotational torque from the power transfer system TSM or the rotational torque which is produced by the motor generator MG1 is transmitted to a wheel via a transmission TM and a differential gear DEF. On the other hand, during an operation of regenerative braking, the rotational torque is transmitted from the wheel to the motor generator MG1 and AC power is produced based on the supplied rotational torque. The produced AC power is converted into DC power by a power conversion apparatus 200, as will be described later, so as to be charged in a high-voltage battery 136. The charged power is used again as a driving energy.

The power conversion apparatus 200 will be described. An inverter circuit 140 is electrically connected to a battery 136 via a DC connector 138 so that a power is transmitted between the inverter circuit 140 and the battery 136. When the motor generator MG1 is to be operated as a motor, the inverter circuit 140 produces AC power based on the DC power supplied from the battery 136 via a DC connector 138 and supplies the AC power to the motor generator MG1 via the AC terminal 188. The structure constituted with the motor generator MG1 and the inverter circuit 140 operates as a first motor generator unit.

In the embodiment, the vehicle can be driven only by the power from the motor generator MG1, which is provided by operating the first motor generator unit as a motor unit using the power from the battery 136. Further, in the embodiment, the battery 136 can be charged by operating the first motor generator unit as a generator unit using the power from the engine EGN or the wheel so as to generate power.

The power conversion apparatus 200 includes a capacitor module 500 for smoothing the DC power supplied to the inverter circuit 140.

The power conversion apparatus 200 includes a communication connector 21 for receiving a command from a high-level control apparatus or sending a data representing the state to the high-level control apparatus. The power conversion apparatus 200 carries out processing to obtain a degree of controlling the motor generator MG1 by a control circuit 172 based on a command input from the connector 21. The power conversion apparatus 200 further carries out processing to determine whether the motor generator MG1 is to be operated as a motor or a generator, and produces a control pulse, based on the result of the processing, which is supplied to a driver circuit 174. Based on the supplied control pulse, the driver circuit 174 produces a driving pulse for controlling the inverter circuit 140.

Figure 2:
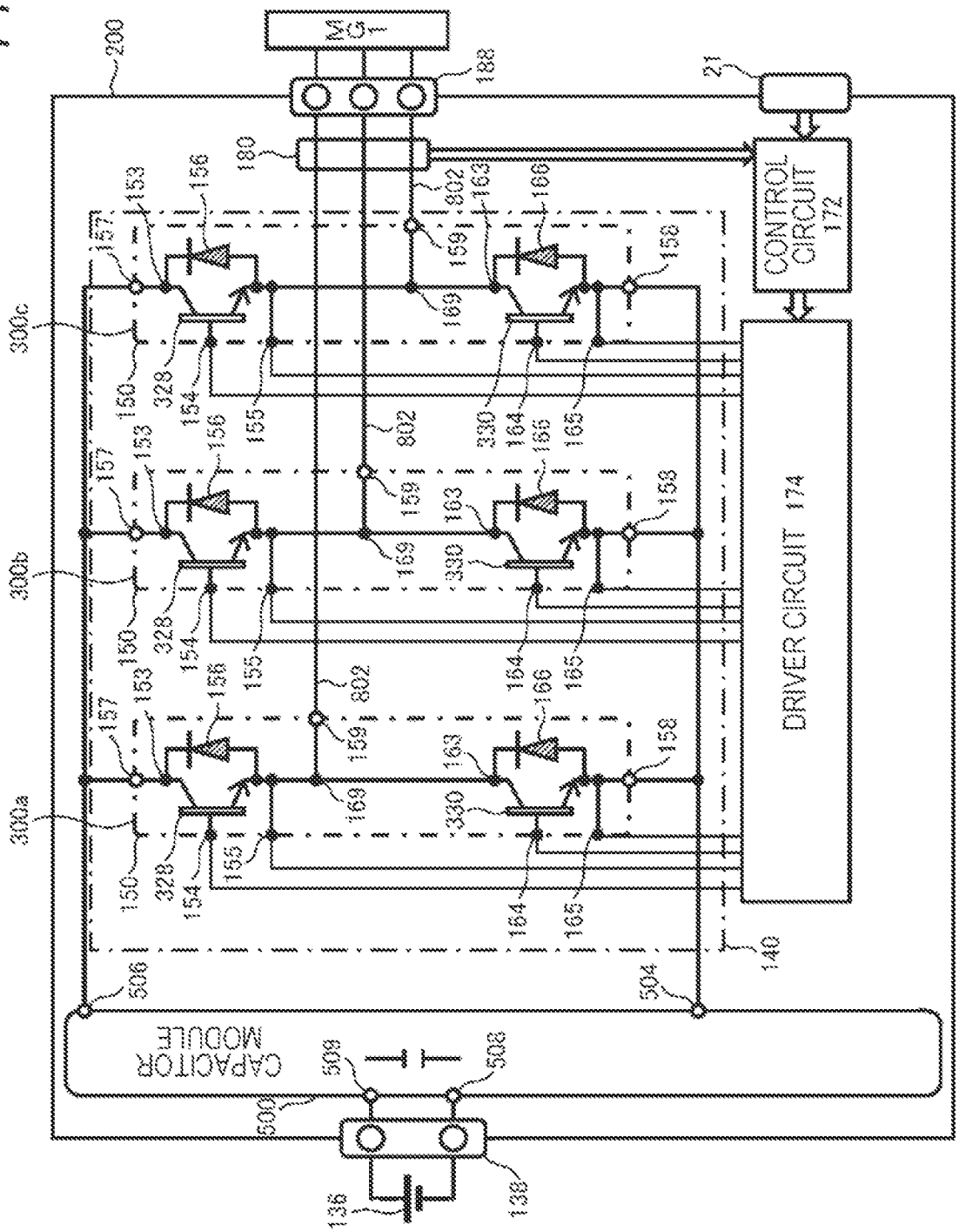
FIG. 2 is a block diagram of an electric circuit of an inverter circuit 140.
Figure 3:
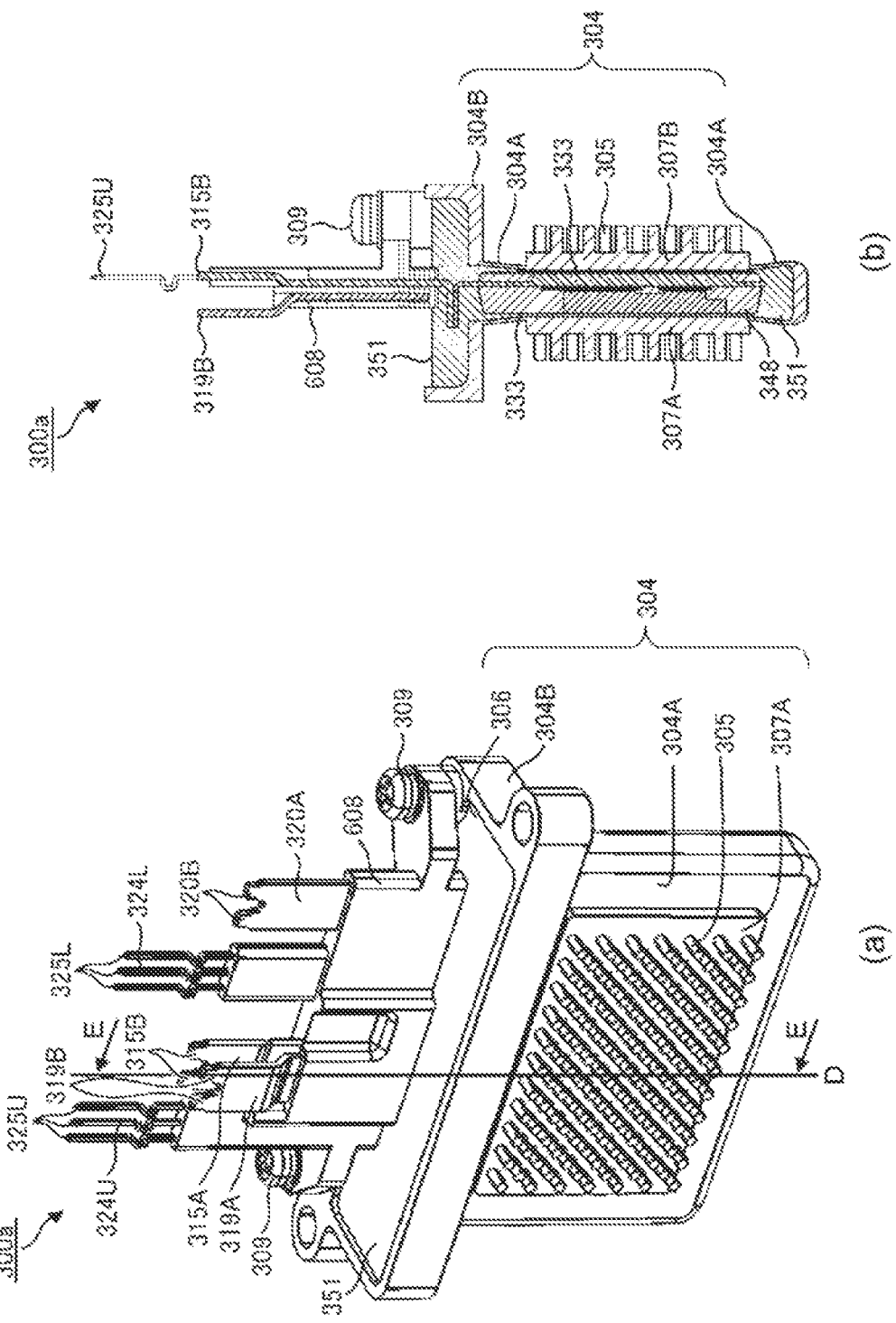
FIG. 3(a) is a perspective view of a power semiconductor module 300a of a power conversion apparatus according to the present invention.
FIG. 3(b) is a cross sectional view of a power semiconductor module 300a taken along the section D and viewed in the direction E.
Figure 4:
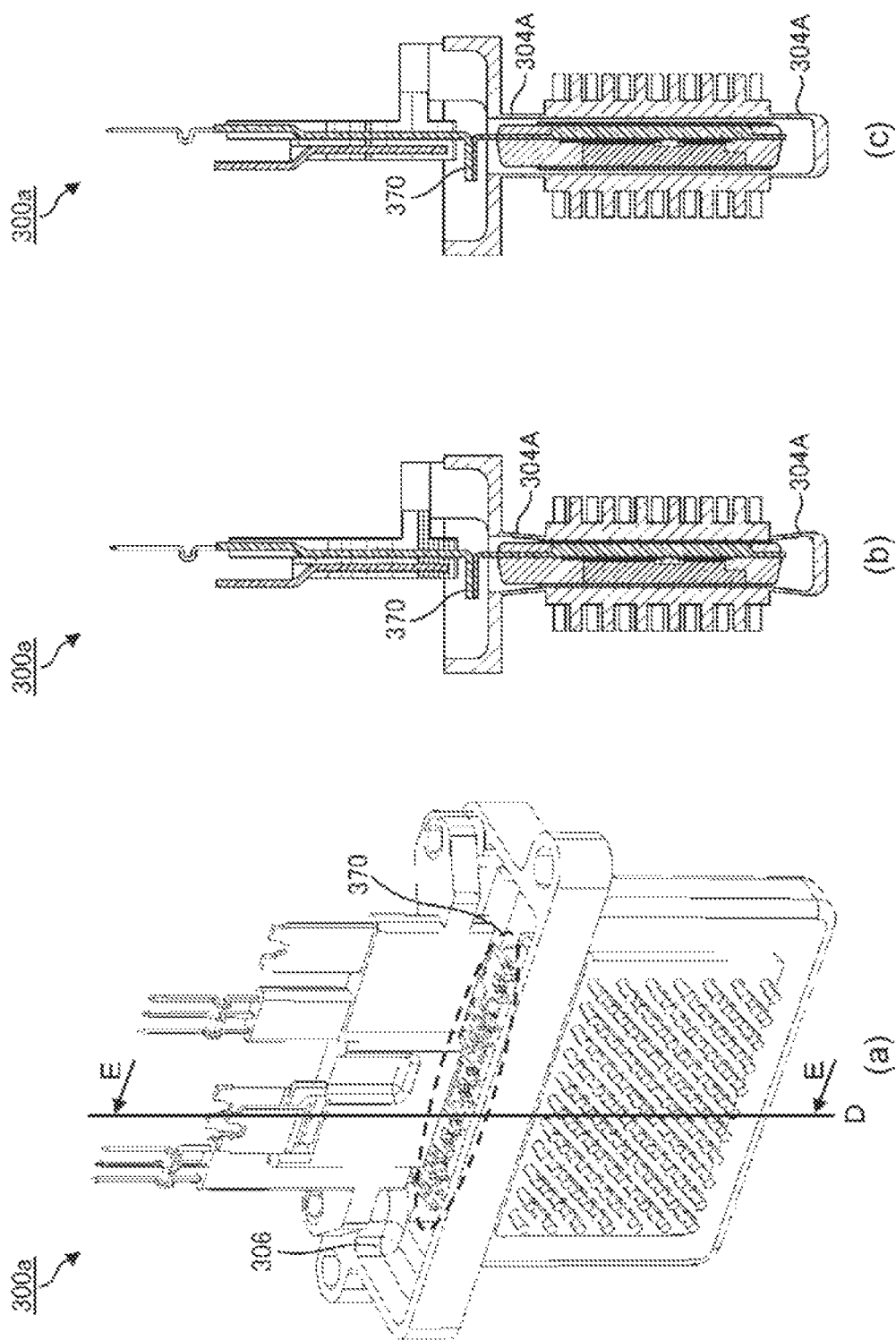
FIG. 4(a) is a figure in which a second sealing resin 351 is removed from FIG. 3(a).
FIG. 4(b) is a figure in which the second sealing resin 351 is removed from FIG. 3(b).
FIG. 4(c) is a cross sectional view illustrating a curved portion 304A before being deformed by pressurizing a fin 305.
Figure 5:
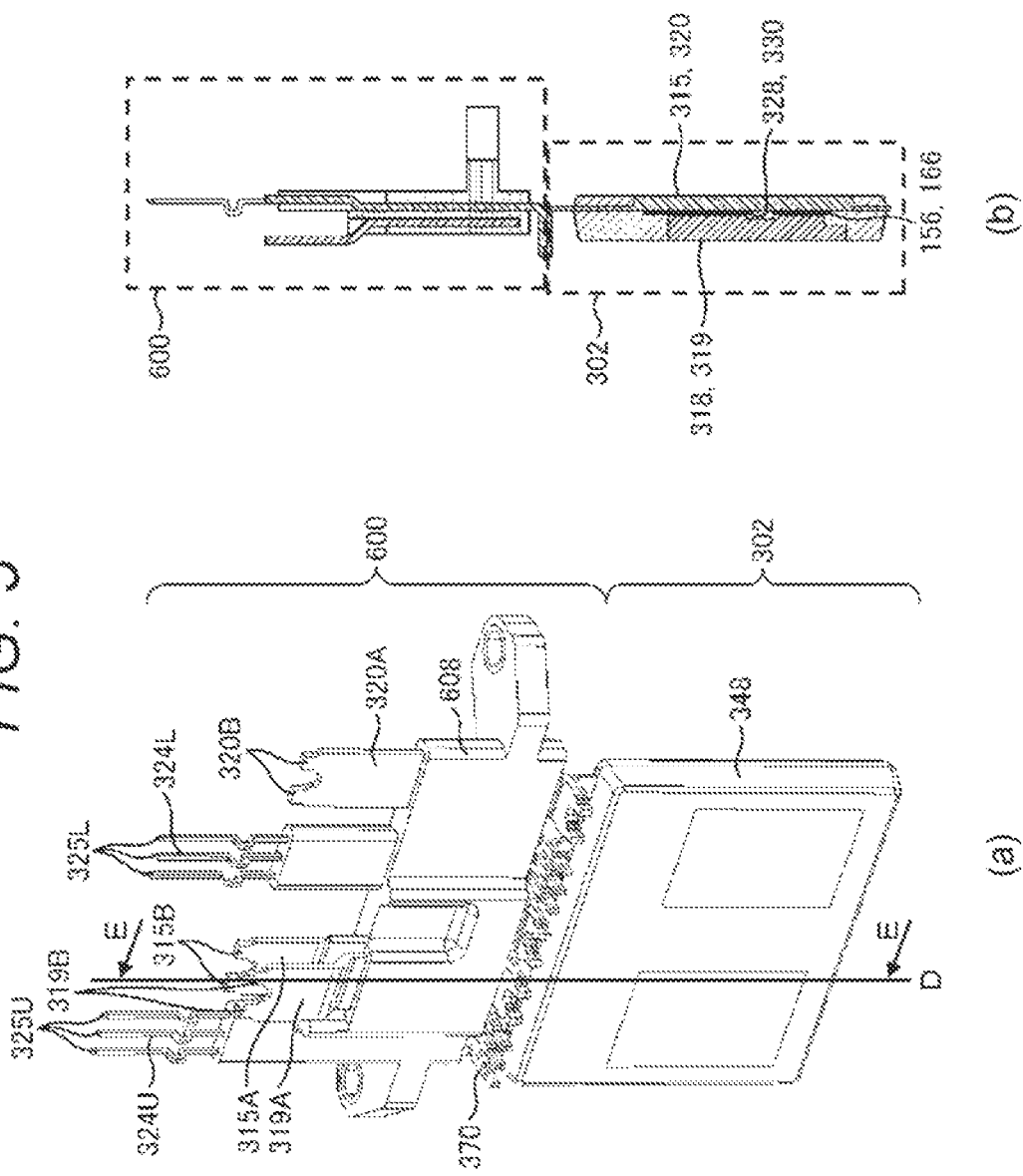
FIG. 5(a) is a perspective view of a power semiconductor module 300a before being sealed in a module case 304.
FIG. 5(b) is a cross sectional view of the power semiconductor module 300a taken along the section D and viewed in the direction E.

The structure of the electric circuit of the inverter circuit 140 will be described using FIG. 2. An insulated gate bipolar transistor is used as a semiconductor cell, which will be referred to as IGBT for short, hereinafter. An IGBT 328 which operates as a high side arm, a diode 156, an IGBT 330 which operates as a low side arm, and a diode 166 constitute a series circuit 150 having the high side and the low side arms. The inverter circuit 140 includes the series circuits 150 each of which corresponding to each of three phases, that is, U-phase, V-phase, and W-phase, of the AC power to be output.

In the embodiment, each of the three phases corresponds to each armature winding of three phases of the motor generator MG1. The series circuit 150 having the high side and the low side arms for each of the three phases outputs AC current from an intermediate electrode 169 which is in a center portion of the series circuit. The intermediate electrode 169 is connected to an AC bus bars 802, 804, and such which are AC power lines to the motor generator MG1, as will be described later, through an AC terminal 159 and an AC terminal 188.

A collector electrode 153 of the high side arm IGBT 328 is electrically connected to a positive side capacitor terminal 506 of the capacitor module 500 via a positive terminal 157. An emitter electrode of the low side arm IGBT 330 is electrically connected to a negative side capacitor terminal 504 of the capacitor module 500 via a negative terminal 158.

As described above, the control circuit 172 receives a control command from the high-level control apparatus via the connector 21. Based on the control command, the control circuit 172 produces a control signal pulse and supplies the control signal pulse to the driver circuit 174. The control signal pulse is used for controlling the IGBT 328 or the IGBT 330 constituting a high side arm or a low side arm of the series circuit 150 for each phase constituting the inverter circuit 140.

Based on the control pulse, the driver circuit 174 supplies a driving pulse for controlling the IGBT 328 or the IGBT 330 constituting the high side arm or the low side arm of the series circuit 150 for each phase to the IGBT 328 or the IGBT 330 for each phase. Based on the driving pulse from the driver circuit 174, the IGBT 328 or the IGBT 330 carries out a conduction or a cut off operation so as to convert the DC power supplied from the battery 136 into three-phase AC power. The converted power is supplied to the motor generator MG1.

The IGBT 328 includes the collector electrode 153, a signal emitter electrode 155, and a gate electrode 154. Further, the IGBT 330 includes, a collector electrode 163, a signal emitter electrode 165, and a gate electrode 164. The diode 156 is electrically connected between the collector electrode 153 and the emitter electrode 155. Further, the diode 166 is electrically connected between the collector electrode 163 and the emitter electrode 165.

A metal-oxide semiconductor field-effect transistor (hereinafter referred to as MOSFET for short) may be used as a switching power semiconductor cell. In this case, the diode 156, the diode 166, and such are not necessary. As a switching power semiconductor cell, the IGBT is suitable in a case when DC voltage is relatively high, and the MOSFET is suitable for a case when DC voltage is relatively low.

The capacitor module 500 includes a capacitor terminal 506 in the positive side, a capacitor terminal 504 in the negative side, a power terminal 509 in the positive side, and a power terminal 508 in the negative side. The high voltage DC power from the battery 136 is supplied to the power terminal 509 in the positive side or the power terminal 508 in the negative side via the DC connector 138, and then supplied to the inverter circuit 140 from the capacitor terminal 506 in the positive side and the capacitor terminal 504 in the negative side of the capacitor module 500.

On the other hand, the DC power converted from AC power by the inverter circuit 140 is supplied to the capacitor module 500 from the capacitor terminal 506 in the positive side and the capacitor terminal 504 in the negative side, and then supplied to the battery 136 from the power terminal 509 in the positive side and the power terminal 508 in the negative side via the DC connector 138 to be stored in the battery 136.

The control circuit 172 includes a micro computer (hereinafter referred to as MICOM) for carrying out the processing of a switching-timing of the IGBT 328 and the IGBT 330. The input information for the MICOM includes a target torque value which is required for the motor generator MG1, a value of the current which is supplied to the motor generator MG1 from the series circuit 150, and positions of the magnetic poles of the rotor of the motor generator MG1.

The target torque value is based on a command signal output from the high-level control apparatus which is not shown in the drawings. The value of the current is detected based on a detecting signal of a current sensor 180. The positions of the magnetic poles are detected based on a detecting signal output from a rotating magnetic pole sensor (not shown in the drawings) such as a resolver provided in the motor generator MG1. As an example, in the embodiment, the current sensor 180 detects the value of the three-phase current. However, the current sensor 180 may detect the value of the current of two phases and carry out processing to obtain the current for three phases.

The MICOM in the control circuit 172 carries out processing to obtain a current command value for the d-axis and the q-axis of the motor generator MG1 based on the target torque value. The MICOM carries out processing to obtain a voltage command value for the d-axis and the q-axis based on differences between the obtained current command values for the d-axis and the q-axis and the detected values of current of the d-axis and the q-axis. The MICOM converts the voltage command values for the d-axis and the q-axis obtained by the processing into the voltage command values for the U-phase, V-phase, and W-phase based on the detected positions of the magnetic poles. Then, the MICOM produces a pulse modulating wave based on the comparison between a fundamental wave (sinusoidal wave) based on the voltage command values for the U-phase, V-phase, and W-phase and a carrier wave (triangular wave). The MICOM outputs the produced modulating wave as a PWM (pulse width modulation) signal to the driver circuit 174.

When the low side arm is to be driven, the driver circuit 174 outputs a drive signal which is an amplified PWM signal to a gate electrode of the corresponding low side arm IGBT 330. Further, when the high side arm is to be driven, the driver circuit 174 amplifies the PWM signal after shifting the level of the base voltage of the PWM signal to the base voltage of the high side arm. Then, the driver circuit 174 outputs the amplified PWM signal as a drive signal to each gate electrode of the corresponding high side arm IGBT 328.

Further, the MICOM in the control circuit 172 carries out an anomaly detection (such as excessive current, excessive voltage, and excessive temperature) to protect the series circuit 150. For this reason, sensing information is input to the control circuit 172. For example, information of a current flowing from the signal emitter electrode 155 and the signal emitter electrode 165 in each arm to the emitter electrode of the IGBT 328 and the IGBT 330 is input to the corresponding driving portion (IC). By this, each driving portion (IC) carries out an excessive current detection. When an excessive current is detected, the driving portion (IC) stops the switching operation of the corresponding IGBT 328 and IGBT 330 to protect the corresponding IGBT 328 and IGBT 330 from the excessive current.

The information of the temperature of the series circuit 150 is input to the MICOM from a temperature sensor (not shown in the drawings) provided in the series circuit 150. Further, the information of the DC voltage in the positive side of the series circuit 150 is input to the MICOM. Based on the information, the MICOM carries out an excessive temperature detection and an excessive voltage detection. When an excessive temperature or an excessive voltage is detected, the MICOM stops the switching operation of every IGBTs 328 and IGBTs 330.

The detail structure of the power semiconductor modules 300a to 300c used for the inverter circuit 140 is described using FIGS. 3 to 7. The structure of each of the power semiconductor modules 300a to 300c is the same. The structure of the power semiconductor module 300a will be described as a representation. In FIGS. 3 to 7, a signal terminal 325U corresponds to the gate electrode 154 and the signal emitter electrode 155 illustrated in FIG. 2, and a signal terminal 325L corresponds to the gate electrode 164 and the emitter electrode 165 disclosed in FIG. 2. Further, a DC positive terminal 315B is same as the positive terminal 157 illustrated in FIG. 2, and a DC negative terminal 319B is same as the negative terminal 158 illustrated in FIG. 2. The AC terminal 320B is same as the AC terminal 159 illustrated in FIG. 2.

FIG. 3(a) is a perspective view of the power semiconductor module 300a of the embodiment. FIG. 3(b) is a cross sectional view of the power semiconductor module 300a of the embodiment cut along the section D and viewed in the direction E.

FIGS. 4(a), 4(b), and 4(c) illustrate the power semiconductor module 300a of FIGS. 3(a), 3(b), and 3(c) from which a screw 309 and the second sealing resin 351 are removed for the help of understanding. FIG. 4(a) is a perspective view. FIG. 4(b) is a cross sectional view cut along the section D and viewed in the direction E as in a manner similar to FIG. 3(b). FIG. 4(c) is a cross sectional view illustrating a curved portion 304A before being deformed by pressurizing a fin 305.

FIGS. 5(a) and 5(b) illustrate the power semiconductor module 300a of FIGS. 4(a) to 4(c) from which a module case 304 is further removed. FIG. 5(a) is a perspective view. FIG. 5(b) is a cross sectional view cut along the section D and viewed in the direction E as in a manner similar to FIG. 3(b) and FIG. 4(b).

Figure 6:
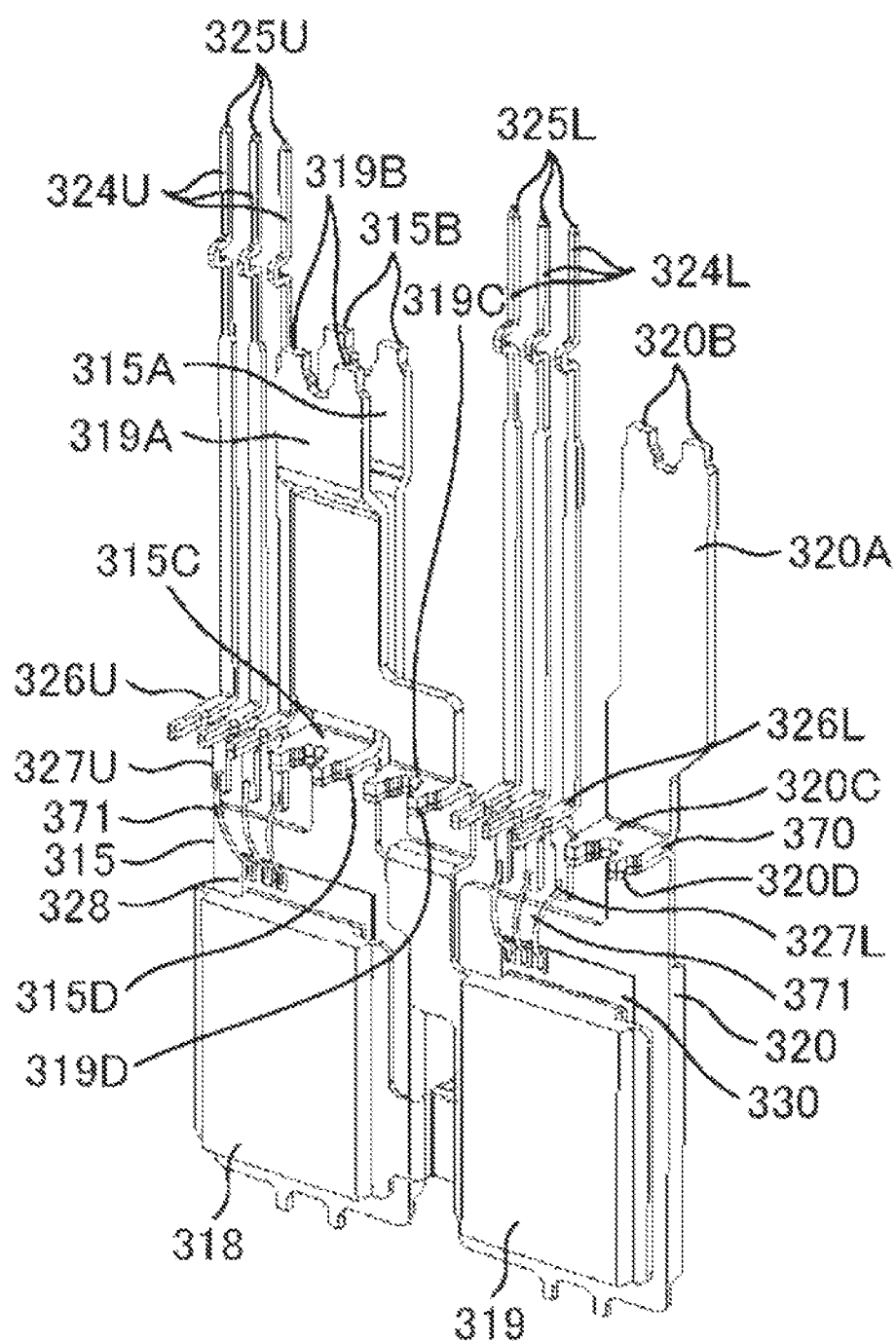
FIG. 6 is a perspective view of the power semiconductor module 300a in which a first sealing resin 348 and a bus line insulation portion 608 is further removed from the state illustrated in FIG. 5(a).

FIG. 6 is a perspective view of the power semiconductor module 300a in which a first sealing resin 348 and a bus line insulation portion 608 are further removed from the state illustrated in FIGS. 5(a) and 5(b).

Figure 7:
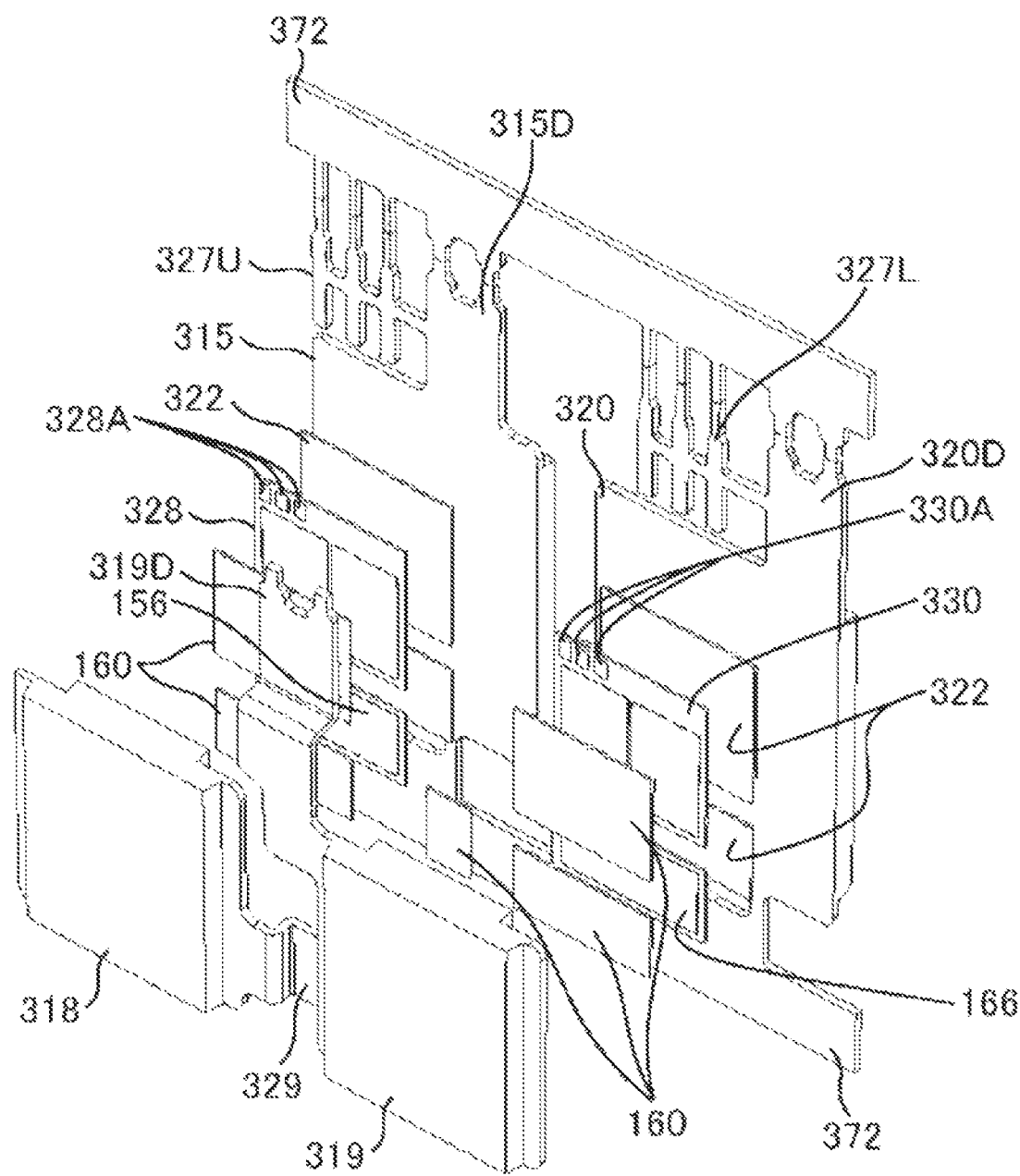
FIG. 7 is a figure for explaining an assembly procedure of a primary sealed module 302.

FIG. 7 is a figure for explaining an assembly procedure of a primary sealed module 302.

The power semiconductor cells (the IGBT 328, the IGBT 330, the diode 156, and the diode 166) constituting the series circuits 150 of the high side and the low side arms are held at both sides thereof between a conductor plate 315, a conductor plate 318, and such or a conductor plate 320, a conductor plate 319, and such to be fixed, as illustrated in FIGS. 5(a) and 5(b) and FIG. 7. The conductor plate 315 or the like is sealed with the first sealing resin 348 with a heat dissipation surface of the conductor plate exposed. An insulation sheet 333 is attached to the heat dissipation surface by thermal compression bonding. As illustrated in FIGS. 5(a) and 5(b), the first sealing resin 348 has a shape of a polyhedron (approximately a rectangular parallelepiped-shape in the embodiment).

The primary sealed module 302 sealed with the first sealing resin 348 is inserted into the module case 304 and attached to the inner surface of the module case 304 which is a CAN-shape cooling structure by thermal compression bonding with the insulation sheet 333 in between. The CAN-shape cooling structure is an annular-shaped cooling structure having an insert port 306 in one end and a bottom in the other end. The remaining air gap inside the module case 304 is filled with a second sealing resin 351.

The module case 304 is configured with a member having electric conductivity, for example, an aluminum alloy material (Al, AlSi, AlSiC, Al—C, or the like), and integrally formed without a seam. The module case 304 is configured to have no opening other than the insert port 306 of which periphery is surrounded by a flange 304B. Further, as illustrated in FIG. 3(a), a first heat dissipation surface 307A and a second heat dissipation surface 307B which have larger surface area than the other surfaces are arranged to face each other. Each power semiconductor cells (the IGBT 328, the IGBT 330, the diode 156, and the diode 166) are arranged so as to face the heat dissipation surfaces. Three planes which connect the first heat dissipation surface 307A and the second heat dissipation surface 307B facing each other have a width smaller than those of the first heat dissipation surface 307A and the second heat dissipation surface 307B. The three planes are constituted so as to be sealed between each other. The insert port 306 is formed on the other plane. The shape of the module case 304 need not be a correct rectangular parallelepiped, and may have a curved surface in the edge as illustrated in FIG. 3(a).

By using a metal case having such shape, sealability against coolant can be secured at the flange 304B even when the module case 304 is inserted into a cooling flow channel (described later) in which a coolant such as water or oil flows. Thereby, the penetration of the cooling medium into the module case 304 can be prevented by a simple configuration.

Further, the fin 305 is uniformly formed on each of the first heat dissipation surface 307A and the second heat dissipation surface 307B facing each other. Further, in the periphery of the first heat dissipation surface 307A and the second heat dissipation surface 307B, the curved portion 304A of which the thickness is extremely small is formed. The thickness of the curved portion 304A is provided to be extremely small so as to easily deform by pressurizing the fin 305, thereby improving productivity after the primary sealed module 302 is inserted.

As described above, by thermal compression bonding of the conductor plate 315 or the like to the inner surface of the module case 304 via the insulation sheet 333, the air gap between the conductor plate 315 or the like and the inner surface of the module case 304 can be small, whereby the heat generated by the power semiconductor cell can efficiently be transferred to the fin 305. Further, by providing sufficient thickness and flexibility to the insulation sheet 333, the insulation sheet 333 can absorb and prevent the thermal stress, which is preferable when used in a power conversion apparatus for a vehicle in which the temperature greatly changes.

A DC positive bus line 315A and a DC negative bus line 319A made of metal for providing electrical connection with the capacitor module 500 are provided outside the module case 304. On the distal end of the DC positive bus line 315A and a DC negative bus line 319A, a DC positive terminal 315B (157) and a DC negative terminal 319B (158) are formed respectively. Further, an AC bus line 320A made of metal for supplying AC power to the motor generator MG1 or MG2 is provided, on which distal end an AC terminal 320B (159) is formed. As illustrated in FIG. 6, in the embodiment, the DC positive bus line 315A is connected to the conductor plate 315, the DC negative bus line 319A is connected to the conductor plate 319, and the AC bus line 320A is connected to the conductor plate 320.

Signal bus lines 324U and 324L made of metal for providing electrical connection with the driver circuit 174 are further provided outside the module case 304. On the distal end of the signal bus lines 324U and 324L, a signal terminal 325U (154 or 155) and a signal terminal 325L (164 or 165) are formed respectively. As illustrated in FIG. 6, in the embodiment, the signal bus line 324U is connected to the IGBT 328, and the signal bus line 324L is connected to the IGBT 330.

The DC positive bus line 315A, the DC negative bus line 319A, the AC bus line 320A, the signal bus line 324U, and the signal bus line 324L are insulated between each other by a bus line insulation portion 608 formed of resin material and integrally formed as a mold terminal 600. The bus line insulation portion 608 also functions as a support member for supporting each of the bus lines. An insulating thermosetting resin or an insulating thermoplastic resin is suitable for a resin material used for the bus line insulation portion 608. In this manner, the insulation among the DC positive bus line 315A, the DC negative bus line 319A, the AC bus line 320A, the signal bus line 324U, and the signal bus line 324L can be provided, whereby a compact bus line can be provided.

The mold terminal 600 (see FIGS. 5(a) and 5(b)) is connected to the primary sealed module 302 by metallic bonding at a connection portion 370, and then fixed to the module case 304 by the screw 309 which penetrates a screw hole provided in the bus line insulation portion 608. For a metallic bonding between the primary sealed module 302 and the mold terminal 600 in the connection portion 370, for example, the tungsten inert gas welding can be used. The DC positive bus line 315A and the DC negative bus line 319A are laminated to face each other with the bus line insulation portion 608 in between to form a shape extending in approximately parallel direction.

Being arranged and formed in the manner described above, the currents instantly produced by the switching operation of the power semiconductor cell flow in parallel but in the opposite directions. In this manner, the magnetic fields produced by the currents affect and cancel each other, and by this effect, low inductance can be provided. The AC bus line 320A and the signal terminals 325U and 325L also extend in the direction similar to the direction of the DC positive bus line 315A and the DC negative bus line 319A.

The connection portion 370 in which the primary sealed module 302 and the mold terminal 600 are connected by metallic bonding is sealed in the module case 304 by the second sealing resin 351. In this manner, an insulation distance necessary between the connection portion 370 and the module case 304 can stably be provided, by which further downsizing of the power semiconductor module 300a can be realized compared to a case with no sealing.

As illustrated in FIG. 6, in the side of the mold terminal 600 of the connection portion 370 (see FIGS. 5(a) and 5(b)), a mold-terminal-side DC positive connecting terminal 315C, a mold-terminal-side DC negative connecting terminal 319C, a mold-terminal-side AC connecting terminal 320C, a mold-terminal-side signal connecting terminal 326U, and a mold-terminal-side signal connecting terminal 326L are arranged to be in a line. On the other hand, in the side of the primary sealed module 302 of the connection portion 370, a cell-side DC positive connecting terminal 315D, a cell-side DC negative connecting terminal 319D, a cell-side AC connecting terminal 320D, a cell-side signal connecting terminal 327U, and a cell-side signal connecting terminal 327L are arranged in a line along a surface of the first sealing resin 348 having a polyhedron shape. The structure in which the terminals are arranged in a line in the connection portion 370 makes it easy to produce the primary sealed module 302 by transfer molding.

The positional relationship between terminals, when portions with a same type extending outside from the first sealing resin 348 of the primary sealed module 302 are considered as a single terminal, will be described. In the following description: the terminal configured with the DC positive bus line 315A (including a DC positive terminal 315B and the mold-terminal-side DC positive connecting terminal 315C) and the cell-side DC positive connecting terminal 315D is referred to as a positive side terminal; the terminal configured with the DC negative bus line 319A (including the DC negative terminal 319B and the mold-terminal-side DC negative connecting terminal 319C) and the cell-side DC negative connecting terminal 319D is referred to as a negative side terminal; the terminal configured with the AC bus line 320A (including the AC terminal 320B and the mold-terminal-side AC connecting terminal 320C) and the cell-side AC connecting terminal 320D is referred to as an output terminal; the terminal configured with the signal bus line 324U (including the signal terminal 325U and the mold-terminal-side signal connecting terminal 326U) and the cell-side signal connecting terminal 327U is referred to as a signal terminal for the high side arm; and the terminal configured with the signal bus line 324L (including the signal terminal 325L and the mold-terminal-side signal connecting terminal 326L) and the cell-side signal connecting terminal 327L is referred to as a signal terminal for the low side arm.

Every terminal described above protrudes from the first sealing resin 348 and the second sealing resin 351 through the connection portion 370, and the portions protruding from the first sealing resin 348 (the cell-side DC positive connecting terminal 315D, the cell-side DC negative connecting terminal 319D, the cell-side AC connecting terminal 320D, the cell-side signal connecting terminal 327U, and the cell-side signal connecting terminal 327L) are arranged in a line along one surface of the first sealing resin 348 having a shape of a polyhedron as described above. Further, the DC positive bus line 315A and the DC negative bus line 319A protrude from the second sealing resin 351 in a laminated form and extend outside the module case 304. Such configuration prevents an excessive stress to be produced in the connection portion between the power semiconductor cell and the terminals or an excessive gap in a die to be produced, in mold clamping in molding process in the production of the primary sealed module 302 in which the power semiconductor cell is sealed with the first sealing resin 348. Further, since the currents flowing in the laminated DC positive bus line 315A and DC negative bus line 319A, respectively, flow in directions opposite to each other, the magnetic fluxes are produced in the directions so as to cancel each other, whereby low inductance can be provided.

In the side of the mold terminal 600 (see FIGS. 5(a) and 5(b)), the mold-terminal-side DC positive connecting terminal 315C and the mold-terminal-side DC negative connecting terminal 319C are formed on the distal end portions of the DC positive bus line 315A and the DC negative bus line 319A opposite to the sides in which the DC positive terminal 315B and the DC negative terminal are provided, respectively. Further, the mold-terminal-side AC connecting terminal 320C is formed in the distal end portions of the AC bus line 320A opposite to the side in which the AC terminal 320B is provided. The mold-terminal-side signal connecting terminals 326U and 326L are formed in the distal end portions of the signal bus lines 324U and 324L opposite to the sides in which the signal terminals 325U and 325L are provided, respectively.

On the other hand, in the side of the primary sealed module 302, the cell-side DC positive connecting terminal 315D, the cell-side DC negative connecting terminal 319D, and the cell-side AC connecting terminal 320D are formed on the conductor plates 315, 319, and 320, respectively. Further, the cell-side signal connecting terminals 327U and 327L are connected to the IGBTs 328 and 330 by a bonding wire 371.

As illustrated in FIG. 7, the conductor plate 315 in the DC positive side and the conductor plate 320 in the AC output side, and the cell-side signal connecting terminals 327U and 327L, are attached to a common tie bar 372 and integrally processed so as to be arranged in an approximately same plane. A collector electrode of the high side arm IGBT 328, and a cathode electrode of the diode 156 in the high side arm are bonded on the conductor plate 315. A collector electrode of the low side arm IGBT 330, and a cathode electrode of the diode 166 in the low side arm are bonded on the conductor plate 320. The conductor plate 318 and the conductor plate 319 are arranged on the IGBTs 328 and 330 and diodes 156 and 166 to approximately be in a plane. An emitter electrode of the high side arm IGBT 328 and an anode electrode of the diode 156 in the high side arm are bonded on the conductor plate 318. An emitter electrode of the low side arm IGBT 330 and an anode electrode of the diode 166 in the low side arm are bonded on the conductor plate 319. Each of the power semiconductor cells is bonded to a cell bonding portion 322 provided on each of the conductor plates via a metal joining 160. The metal joining 160 is, for example, a low-temperature sintering material containing a solder, an Ag sheet, or a minuscule metal particle.

Each of the power semiconductor cells has a plate-like flattened structure and each electrode of the power semiconductor cell is formed on the front and the back surface of the power semiconductor cell. As illustrated in FIG. 7, each electrode of the power semiconductor cell is placed between the conductor plate 315 and the conductor plate 318, or the conductor plate 320 and the conductor plate 319. That is, the conductor plate 315 and the conductor plate 318 are arranged to be laminated approximately in parallel, facing each other, with the IGBT 328 and the diode 156 in between. Similarly, the conductor plate 320 and the conductor plate 319 are arranged to be laminated approximately in parallel, facing each other, with the IGBT 330 and the diode 166 in between. Further, the conductor plate 320 and the conductor plate 318 are connected via an intermediate electrode 329. By these connections, the high side arm circuit and the low side arm circuit are electrically connected, thereby forming a series circuit with the high side arm and the low side arm. As described above, the IGBT 328 and the diode 156 are inserted between the conductor plate 315 and the conductor plate 318, and the IGBT 330 and the diode 166 are inserted between the conductor plate 320 and the conductor plate 319, and also the conductor plate 320 and the conductor plate 318 are connected via the intermediate electrode 329. Then, a control electrode 328A of the IGBT 328 and the cell-side signal connecting terminal 327U are connected with the bonding wire 371, and a control electrode 330A of the IGBT 330 and the cell-side signal connecting terminal 327L are connected with the bonding wire 371.

Figure 8:
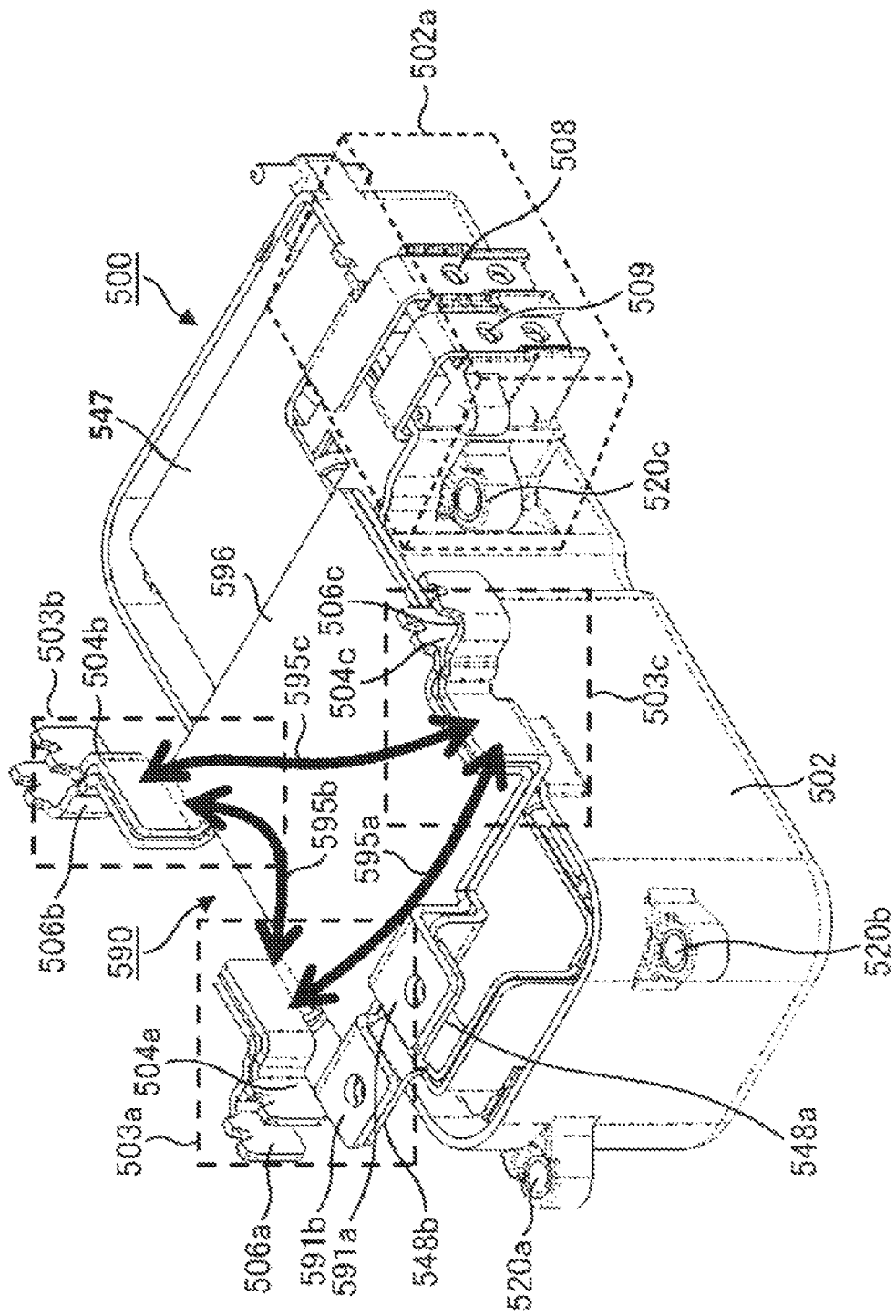
FIG. 8 is a perspective view of a capacitor module 500 of a power conversion apparatus according to the present invention.

FIG. 8 is a perspective view of a capacitor module 500 according to the embodiment. Holes 520a to 520c through which a fixing means, for example, a screw, penetrates to fix the capacitor module 500 to a housing 10 integrally formed with a channel members 12a and 12b (described later, see FIG. 13) are provided in the capacitor module case 502. The channel members 12a and 12b are commonly referred to as a channel member 12.

Further, a protrusion container 502a is formed in a long side surface of the capacitor module case 502. An electric circuit cell which is electrically connected, in series or in parallel, to a film capacitor cell and power terminals 508 and 509 is contained in the protrusion container 502a. The embodiment contains a capacitor 593 for noise removing. The capacitor 593 removes the noise from the battery 136 and is electrically connected to the ground (see FIGS. 12 and 13). The capacitor 593 is downsized compared to the film capacitor cell. Therefore, the height of the protrusion container 502a is formed to be smaller than that of the capacitor module case 502. Therefore, a space is formed beneath the protrusion container 502a. The internal space of the channel member 12 which will be described later forms a portion of the cooling flow channel. In this manner, the capacitor for noise removing can be cooled, and also the rise of pressure loss is prevented by restraining the local increase in the cross section of the cooling flow channel.

Figure 11:
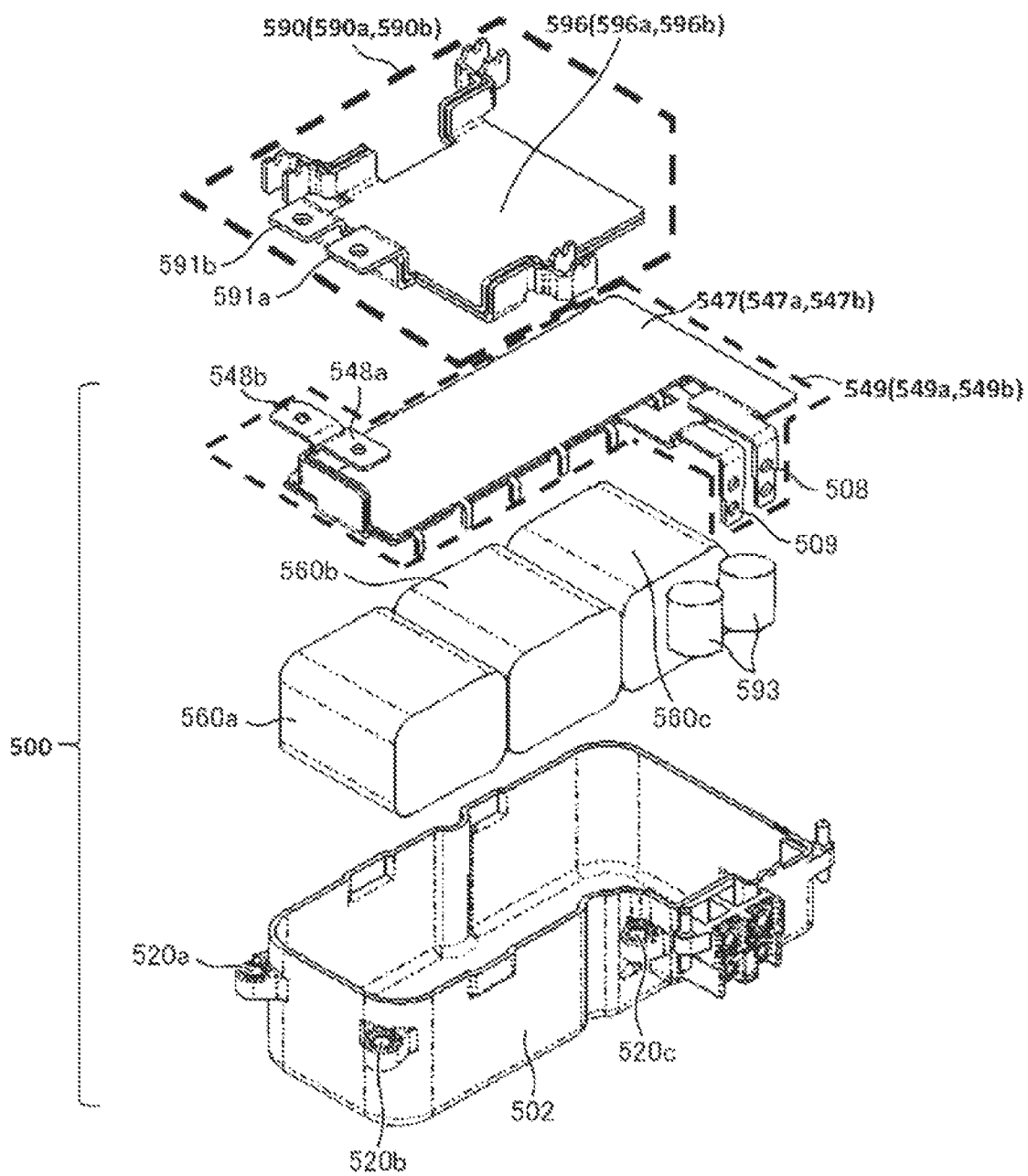
FIG. 11 is an exploded perspective view of a capacitor module 500 of a first embodiment of a power conversion apparatus according to the present invention.

A first bus bar 590 is arranged outside the container space of the capacitor module case 502 and connected to the power semiconductor modules 300a to 300c. Further, the first bus bar 590 (see FIG. 11) includes a negative side bus bar 590b, a positive side bus bar 590a, and an insulation member (not shown in the drawings) arranged between the negative side bus bar 590b and the positive side bus bar 590a. In FIG. 11, the first bus bar 590 is illustrated as two stacked bus bars. The upper bus bar is the positive side bus bar 590a and the lower bus bar is the negative side bus bar 590b. A flat portion 596a of the positive side bus bar 590a and a flat portion 596b of the negative side bus bar 590b are commonly referred to as a flat portion 596 of the first bus bar 590.

Though not illustrated in FIG. 8, a plurality of film capacitor cells, which will be described later, is provided inside the capacitor module case 502. The plurality of film capacitor cells is electrically connected to a negative side bus bar 549b and a positive side bus bar 549a of the second bus bar 549 (see FIG. 11). The insulation member is arranged between the negative side bus bar and the positive side bus bar. The negative side bus bar and the positive side bus bar constitute a laminated structure. That is, the negative side bus bar and the positive side bus bar constitute a laminated second bus bar 548. Though omitted in FIG. 8, a resin sealing material is filled in the capacitor module case 502 to fix the film capacitor cell and the second bus bar 548 in the capacitor module case 502.

Each of the negative side power terminal 508 and the positive side power terminal 509 is electrically connected to the second bus bar 549 arranged in the capacitor module case 502, and protrudes from an opening of the capacitor module case 502 so as to be bent toward the side of the capacitor module case 502. As described in FIG. 2, DC power is supplied to the positive side power terminal 509 and the negative side power terminal 508 via the DC connector 138.

In the embodiment, it is described that the bus bar for transferring DC current is laminated as in the first bus bar 590 and the second bus bar 549. However, as long as the bus bar is configured with a bus bar inside the capacitor module case 502 and a bus bar outside the capacitor module case 502, the form of the bus bar is not limited to a laminated form.

A first terminal 503a, a second terminal 503b, and a third terminal 503c are electrically connected to the first bus bar 590, respectively. The first terminal 503a, the second terminal 503b, and the third terminal 503c are provided corresponding to the positive terminal 157 (315B) and the negative terminal 158 (319B) of the power semiconductor modules 300a to 300c. An insulation sheet is provided between the negative side terminal 504a and the positive side terminal 506a which constitute the first terminal 503a so as to provide insulation. The second terminal 503b and the third terminal 503c are configured in the same manner. Further, the first bus bar 590 includes a fourth terminals 591a and 591b which are connected to the corresponding connecting terminals 548a and 548b located in the portion of the second bus bar 549 protruding from the surface of the sealing material. In FIG. 11, the second bus bar 549 is illustrated as a figure in which two bus bars 549a and 549b are stacked. The upper bus bar is the positive side bus bar 549a and the lower bus bar is the negative side bus bar 549b. A flat portion 547a of the positive side bus bar 549a and a flat portion 547b of the negative side bus bar 549b are commonly referred to as a flat portion 547 of the second bus bar 549.

The interphase current will be described referring to FIG. 8 and FIG. 9.

Figure 9:
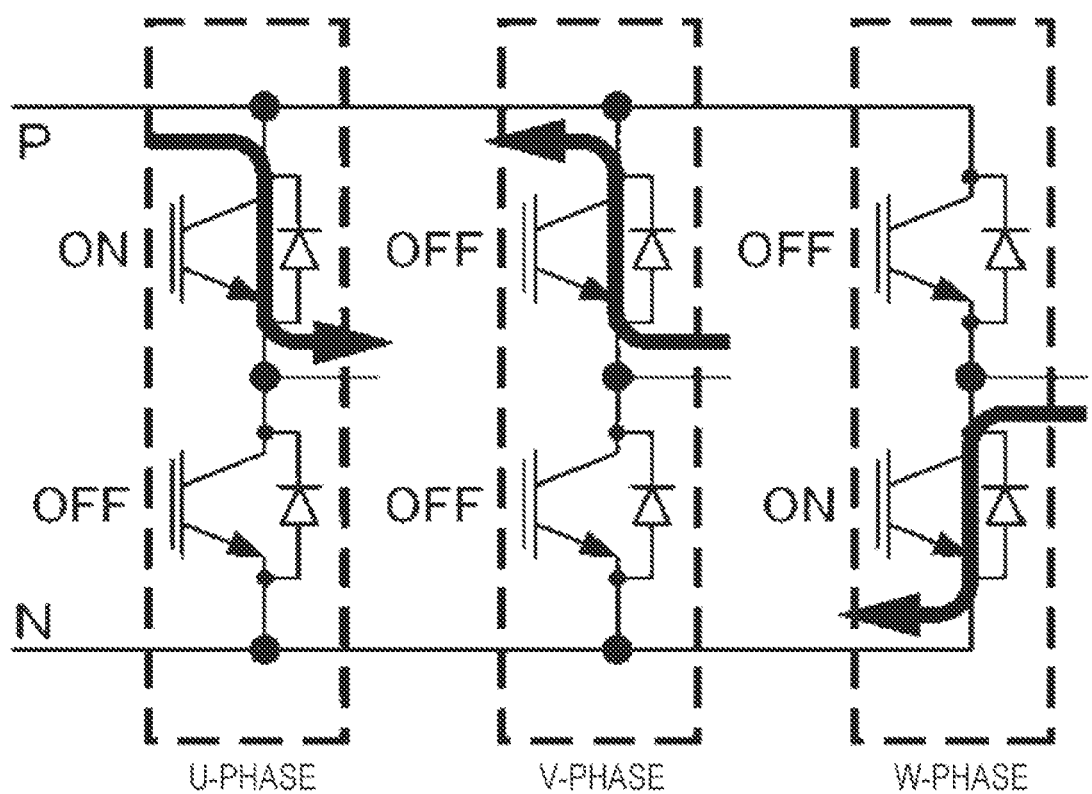
FIG. 9 is a simplified diagram of an inverter circuit of a power conversion apparatus according to the present invention.

FIG. 9 is a simplified diagram of the inverter circuit. When the IGBT in the U-phase high side arm IGBT is ON (the low side arm IGBT is OFF), the V-phase low side arm is OFF (the high side arm IGBT is OFF), and the W-phase low side arm is ON (the high side arm IGBT is OFF), the current flows in a manner as illustrated by the arrow in FIG. 9. The current which flows in the V-phase does not return to the battery side but flows toward the U-phase high side arm IGBT which has lower impedance. The current which flows in the V-phase is referred to as an interphase current. In FIG. 8, the interphase current (595b in FIG. 8) flows from the positive side in the V-phase high side arm (504b in FIG. 8) to the positive side of the U-phase high side arm (504a in FIG. 8).

The interphase current flows only between the high side arms or between the low side arms, and does not flow between the high side arm and the low side arm. The interphase current flows in six ways determined by a combination of an inflow and an outflow of the current between the phases. In FIG. 8, the six ways of the interphase current flowing between the high side arms are illustrated in two-way arrows 595a to 595c.

As mentioned above, the interphase current flows only between the high side arms or between the low side arms. Regarding the interphase current flowing between the high side arms as illustrated in FIG. 8, the current flowing to the connecting terminal 548a of the second bus bar through the fourth terminal 591a of the first bus bar 590 is restrained. That is, the interphase currents (595a to 595c) flow between the power semiconductor modules 300a to 300c via the flat portion 596a of the positive side bus bar 590a of the first bus bar 590.

Similarly, though not illustrated in the drawings, the interphase current which flows between the low side arms flows between the power semiconductor modules 300a to 300c via the flat portion 596b of the negative side bus bar 590b of the first bus bar 590, and is restrained from flowing to the terminal 548b of the second bus bar.

Therefore, by providing the first bus bar 590 as in the embodiment, the interphase current generates heat only in the first bus bar 590, which prevents the thermal effect to a capacitor cell.

Figure 10:
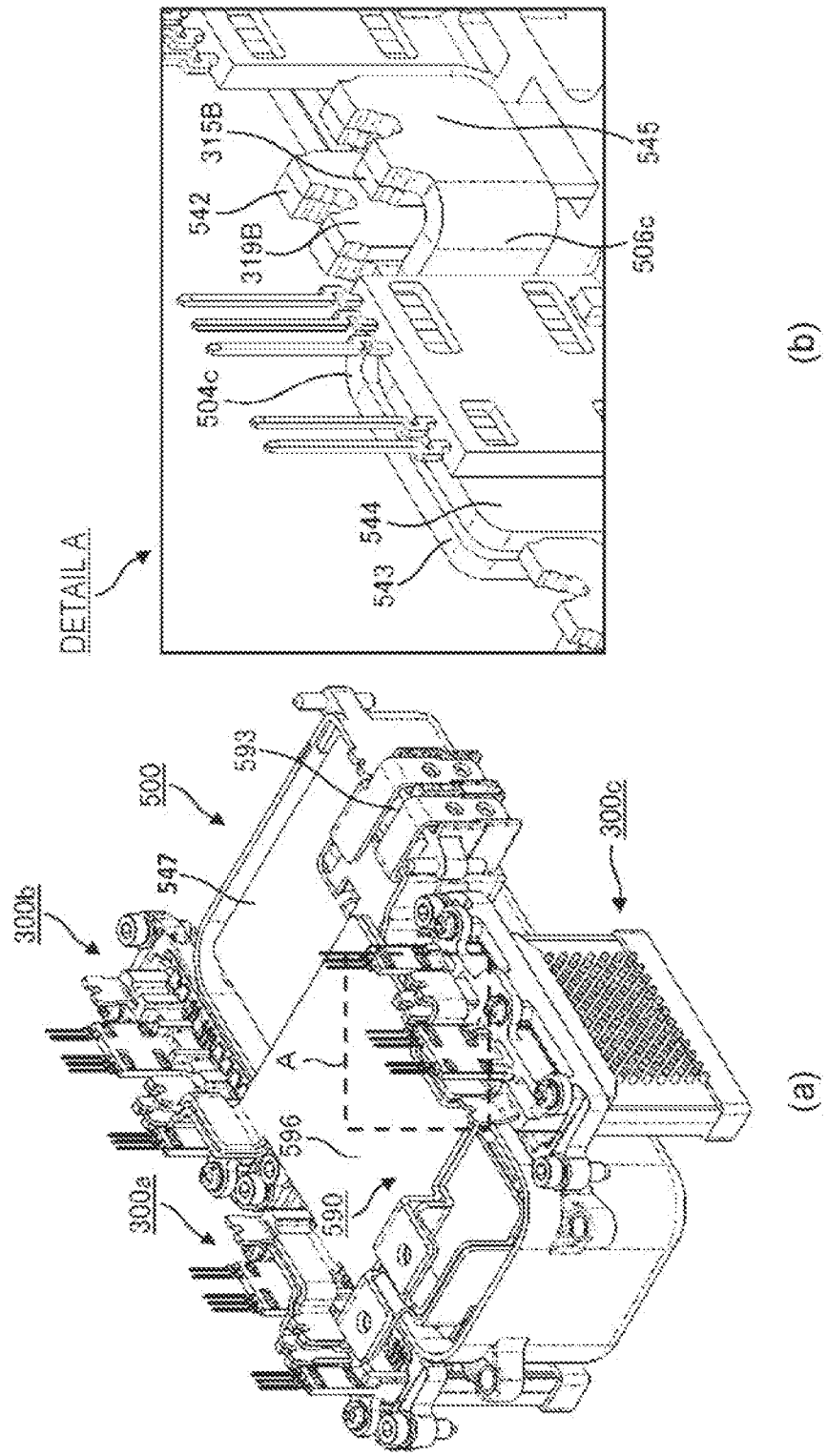
FIG. 10(a) is an external perspective view of a capacitor module 500 assembled with a power semiconductor module 300.
FIG. 10(b) is an enlarged view of a portion A in FIG. 10(a).

FIG. 10(a) is an external perspective view of the capacitor module 500 assembled with the power semiconductor modules 300a to 300c. FIG. 10(b) is an enlarged view of a portion A in FIG. 10(a).

The power semiconductor module 300c is fixed so as to face the power semiconductor module 300a with each other with the capacitor module 500 in between. Further, the capacitor cell 593 for noise removing is arranged in a position so as to face the power semiconductor module 300b with each other with the capacitor module 500 in between. In this manner, the power semiconductor modules 300a to 300c provided for each phase are arranged so that the two of the power semiconductor modules are provided in one side of the capacitor module 500 and the other power semiconductor module is provided in the other side of the capacitor module 500. Even though, the power semiconductor modules 300a to 300c and the capacitor module 500 are still configured in an orderly manner. Further, by flowing a cooling medium between the power semiconductor modules 300a to 300c and the capacitor module 500, both modules can be cooled, which contributes to further downsizing of the power conversion apparatus 200.

Further, as described above, the power terminals 508 and 509 protrude from the protrusion container 502a (see FIG. 8). Therefore, the power terminals 508 and 509 are arranged closer to the capacitor cell 593 for noise removing than any of the power semiconductor modules 300a to 300c (see FIGS. 12 and 13), thereby reducing the effect of noise on the power semiconductor modules 300a to 300c.

Areas of the current path of the DC positive terminal 315B and the DC negative terminal 319B are far smaller than the current path area of the first bus bar 590 and the current path area of the second bus bar 549 inside the capacitor module 500. Therefore, when the current flows into the DC positive terminal 315B and the DC negative terminal 319B, the area of the current path in which the current flows greatly changes. That is, the current concentrates in the DC positive terminal 315B and the DC negative terminal 319B.

In the embodiment, a negative side terminal 504c includes an upright portion 543 extending upward from the first bus bar 590 and has a connecting portion 542 in the distal end thereof. Further, a positive side terminal 506c includes an upright portion 544 extending upward from the first bus bar 590 and has a connecting portion 545 in the distal end thereof. The DC negative terminal 319B or the DC positive terminal 315B of the power semiconductor module 300c is positioned between the connecting portion 542 and the connecting portion 545 to be connected.

In this manner, the negative side terminal 504a and the positive side terminal 506a form a laminate structure having an insulation sheet in between just before the connecting portion 542 and the connecting portion 545, whereby the inductance of the bus bar portion of the capacitor terminal in which the current concentrates can be reduced. Further, the distal end of the DC negative terminal 319B is connected to the side of the connecting portion 542 by welding. Similarly, the distal end of the DC positive terminal 315B is connected to the side of the connecting portion 545 by welding. Therefore, in addition to the loss improvement owning to the reduction of inductance, a successive joining of bus bars can be carried out by one-direction approach assembling process, thereby improving productivity.

FIG. 11 is an exploded perspective view of a smoothing capacitor module 500. The smoothing capacitor module 500 is configured of four main parts. A capacitor cell 560 for smoothing and the capacitor cell 593 for noise removing are contained in the capacitor module case 502 which contains the contents of the capacitor module. The capacitor cell 560 for smoothing is configured of one or a plurality of cells, and connected to the second bus bar 546.

Members or materials existing between the capacitor cells 560a to 560c and the first bus bar 590 are the resin sealing material (not shown in the drawings), the second bus bar 549, the resin sealing material, and air, when listed from the side of the capacitor cell 560 toward the side of the first bus bar 590. Among the listed members or materials, the resin sealing material and the layer of air have low heat conductivity and function as an insulator. Accordingly, the heat produced in the first bus bar 590 by the interphase current flowing in the first bus bar 590 is insulated by the filled resin and the layer of air, thereby restraining the rise in the temperature of the capacitor cell.

The second bus bar 546 is configured to be contained in the capacitor module case 502 and as wide as possible, for example, as wide so as to cover the capacitor cell 560 for smoothing, thereby reducing the electric resistance, which contributes to the reduction of heat generation. The second bus bar 549 extends upward keeping the laminated structure and then is bent so that the positive and the negative electrodes part from each other to form the connecting terminals 548a and 548b to which the fourth terminals 591a and 591b of the first bus bar 590 are connected, respectively. By this structure in which the laminated structure is used even in a detailed portion, the inductance can be reduced. As for the first bus bar 590, the reduction of inductance by the laminated structure and lower heat generation by reducing electrical resistance by widening the width can be provided, as in a manner similar to that of the second bus bar 549. As described above, low inductance is provided by the laminated structure also used in the connection to the power module.

Further, the first bus bar 590 and the second bus bar 549 are arranged in each position so as to face each other, so that the bus line for connecting each other is made short, which can reduce the inductance of the circuit. Further, by positioning the wide planes facing and close to each other, the space for parts arrangement is made small. Therefore, the downsizing in height of the power conversion apparatus can be possible. In the parts arrangement, the first bus bar 590 is arranged so as to stretch over the capacitor module 500, and the current which flows between the power semiconductor module 300a to 300c flows in the widened surface which faces the capacitor module 500 so that the ununiformity of the current is small. This means that the first bus bar 590 generates heat almost uniformly.

Second Embodiment

Figure 12:
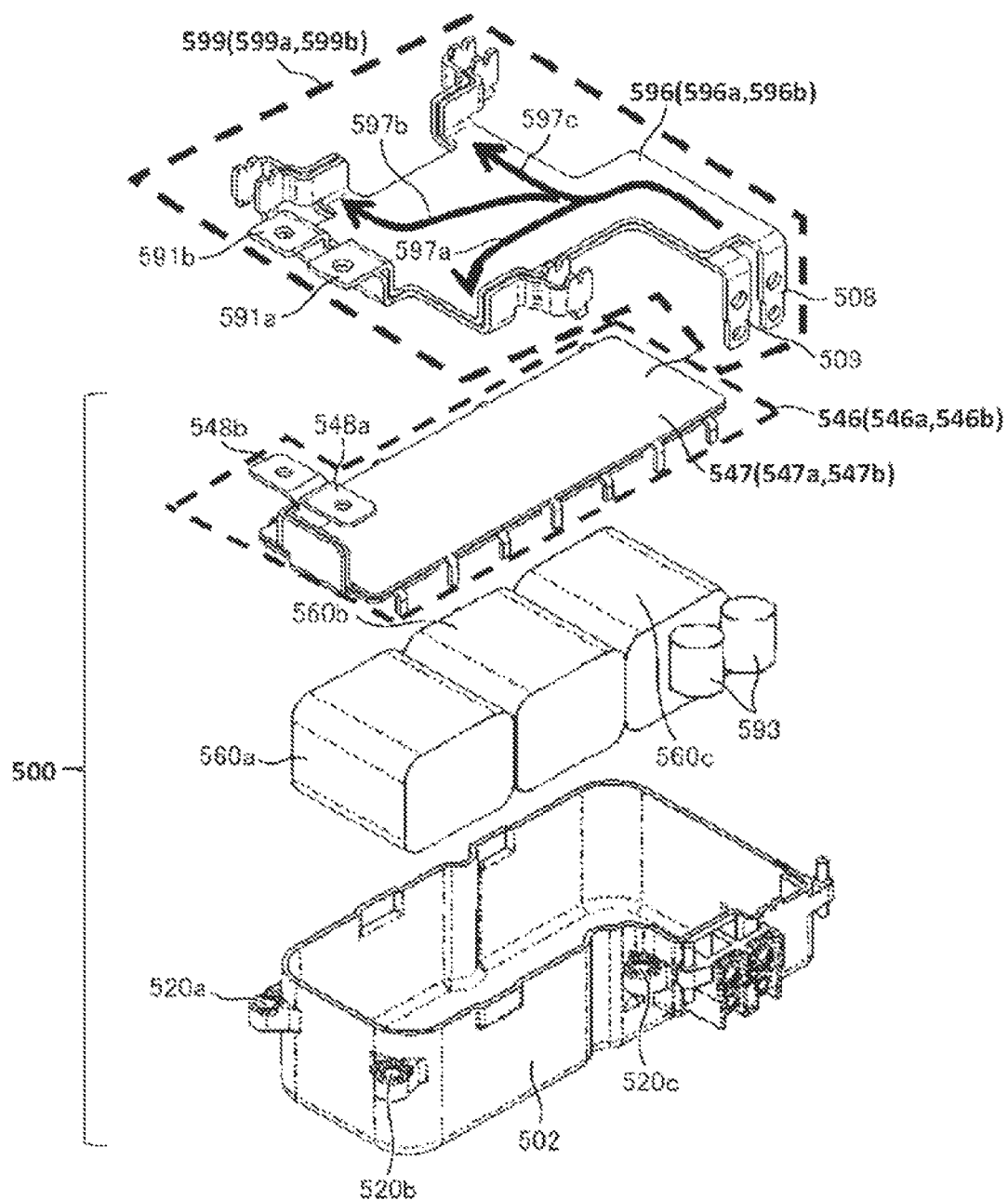
FIG. 12 is an exploded perspective view of a capacitor module 500 of a second embodiment of a power conversion apparatus according to the present invention.

A second embodiment of the power conversion apparatus according to the present invention will be described below referring to FIG. 12. FIG. 12 is an exploded perspective view of a capacitor module 500 of the second embodiment. Similar to the first embodiment, the capacitor module 500 is configured with four main parts. The structure with the same reference sign as the first embodiment (see FIG. 11) has a function similar to that of the first embodiment.

In the embodiment, the second bus bar 546 does not include the power terminals 508 and 509. On the other hand, the first bus bar 599 forms the power terminals 508 and 509, by which the first bus bar 599 receives power supply from the battery before the second bus bar 546. In this configuration, the DC currents 597a to 597c flow directly into the power semiconductor module 300 without passing through the second bus bar 546. Therefore, in this case, the DC current flows only in the first bus bar 599, and in the second bus bar 549, only the current from which the interphase current and the DC current are removed, that is, a ripple current flows. Consequently, the heat generation in the second bus bar 546 is reduced, and the heat received by the capacitor cells 560a to 560c of which the allowable high temperature is low can be moderated.

Similarly to the first embodiment (FIG. 11), the first bus bar 599 is configured with two bus bars (the positive side bus bar 599a and the negative side bus bar 599b), and the second bus bar 546 is also configured with two bus bars (the positive side bus bar 546a and the negative side bus bar 546b). Further, the flat portion of each of the bus bars has the same reference sign as the first embodiment.

Third Embodiment

Figure 13:
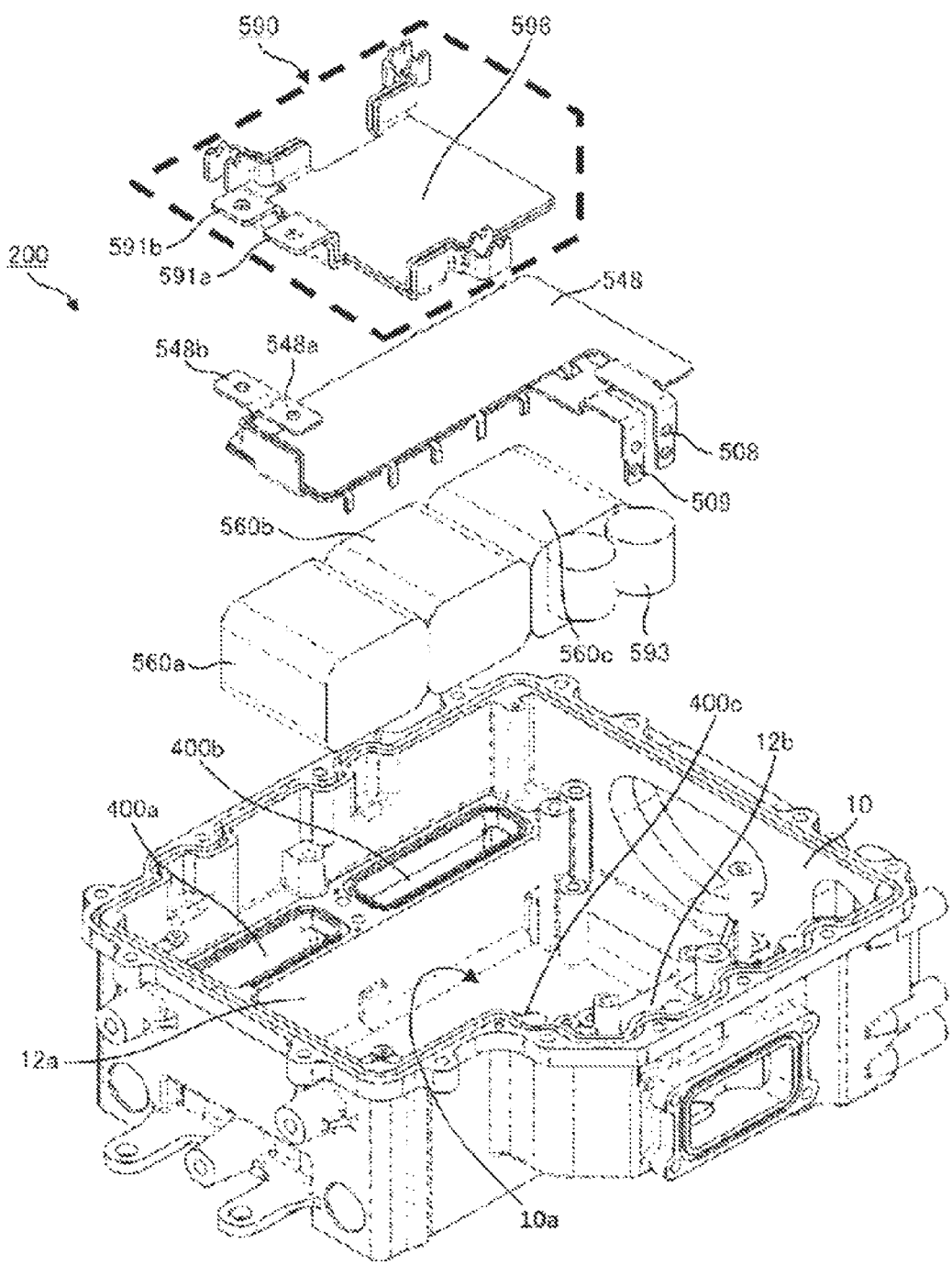
FIG. 13 is an exploded perspective view of a power conversion apparatus 200 of a third embodiment of a power conversion apparatus according to the present invention.

A cooling structure which is a third embodiment of the power conversion apparatus according to the present invention will be described below referring to FIG. 13. In the housing 10 of the power conversion apparatus of the embodiment, a channel member 12 having a channel member 12a and a channel member 12b arranged so as to face the channel member 12a with a container space 10a for a capacitor module 500 in between is integrally formed. The internal space of the channel member 12 forms a cooling channel in which a coolant for cooling the power semiconductor modules 300a to 300c flows.

In the channel member 12a, an opening 400a from which the power semiconductor module 300a is inserted in the cooling channel and an opening 400b from which the power semiconductor module 300b is inserted in the cooling channel are formed. Further, in the channel member 12b, an opening 400c from which the power semiconductor module 300c is inserted in the cooling channel is formed. The opening 400c is recited with a reference sign in FIG. 13, though the opening 400c cannot be viewed in the drawing because of the way the figure is illustrated.

In the embodiment, without providing a capacitor module case 502 included in the capacitor module 500, the capacitor cell 560, the second bus bar 548, the sealing material, and such are arranged in the container space 10a formed by the housing 10 in which the channel members including the channel members 12a and 12b are integrally formed. Consequently, the cooling of the capacitor cell 560 and the second bus bar 548 can be facilitated.

Each of the first and the second embodiments described above can be carried out in combination with the third embodiment.

Further, the present invention is not limited to the embodiment described above and modifications of the embodiment as long as the feature of the present invention is not spoiled.

The disclosure of the following basic application whose priority is claimed is incorporated herein by reference.

Japanese Patent Application No. 2011-121214 (Filed on May 31, 2011)

The invention claimed is:

1. A power conversion apparatus comprising:
   a U-phase power semiconductor module including a high side U-phase circuit and a low side U-phase circuit of an inverter circuit which converts a DC current into an AC current;
   a V-phase power semiconductor module including a high side V-phase circuit and a low side V-phase circuit of the inverter circuit;
   a W-phase power semiconductor module including a high side W-phase circuit and a low side W-phase circuit of the inverter circuit; and
   a capacitor module including a capacitor cell which smoothes the DC current, wherein:
   a first bus bar which is connected to the U-phase, V-phase, and W-phase power semiconductor modules, and the U-phase, V-phase, and W-phase power semiconductor modules are configured separately;
   the capacitor module includes a case for containing the capacitor cell, a sealing material for sealing the capacitor cell, and a second bus bar which is connected to the capacitor cell in the sealing material, a terminal portion of the second bus bar protruding from a surface of the sealing material;
   the first bus bar is configured with a first positive side bus bar, a first negative side bus bar, and a first insulation member arranged between the first positive side bus bar and the first negative side bus bar; and
   the first bus bar further includes a first terminal connected to a terminal extending from the U-phase power semiconductor module, a second terminal connected to a terminal extending from the V-phase power semiconductor module, a third terminal connected to a terminal extending from the W-phase power semiconductor module, and a fourth terminal connected in direct contact with an end portion of the terminal portion of the second bus bar protruding from the surface of the sealing material.

2. The power conversion apparatus according to claim 1, wherein:
   the U-phase power semiconductor module is configured to separately include a high side arm U-phase power semiconductor module having a high side arm circuit of the inverter circuit, and a low side arm U-phase power semiconductor module having a low side arm circuit of the inverter circuit;
   the V-phase power semiconductor module is configured to separately include a high side arm V-phase power semiconductor module having a high side arm circuit of the inverter circuit, and a low side arm V-phase power semiconductor module having a low side arm circuit of the inverter circuit; and
   the W-phase power semiconductor module is configured to separately include a high side arm W-phase power semiconductor module having a high side arm circuit of the inverter circuit, and a low side arm W-phase power semiconductor module having a low side arm circuit of the inverter circuit.

3. The power conversion apparatus according to claim 1, wherein the first bus bar includes a battery side terminal which receives a DC current supplied from a battery.

4. The power conversion apparatus according to claim 1, wherein the second bus bar is configured with a second positive side bus bar, a second negative side bus bar, and a second insulation member arranged between the second positive side bus bar and the second negative side bus bar.

5. The power conversion apparatus according to claim 1, wherein the first bus bar is arranged so as to face the second bus bar.

6. The power conversion apparatus according to claim 5, wherein the U-phase, V-phase, and W-phase power semiconductor modules are arranged so as to locate the capacitor module in between.

7. The power conversion apparatus according to claim 1 further comprising
a power conversion apparatus case which contains the U-phase, V-phase, and W-phase power semiconductor modules and the capacitor module, wherein:
the power conversion apparatus case includes a channel member in which a first channel arranged in the side portion of the capacitor module and a second channel facing the first channel with the capacitor module in between are formed; and
the U-phase and V-phase power semiconductor modules are arranged in the side of the first channel and the W-phase power semiconductor module is arranged in the side of the second channel.

8. The power conversion apparatus according to claim 7, wherein the power conversion apparatus case is integrally formed with the channel member.

9. A power conversion apparatus comprising:
a U-phase power semiconductor module including a high side U-phase circuit and a low side U-phase circuit of an inverter circuit which converts a DC current into an AC current;
a V-phase power semiconductor module including a high side V-phase circuit and a low side V-phase circuit of the inverter circuit;
a W-phase power semiconductor module including a high side W-phase circuit and a low side W-phase circuit of the inverter circuit;
a capacitor module including a capacitor cell which smoothes the DC current;
a first bus bar connected to the U-phase, V-phase, and W-phase power semiconductor modules; and
a second bus bar connected to the capacitor cell and the first bus bar, wherein:
the capacitor module contains the capacitor cell and the second bus bar in a capacitor module case and is sealed by an insulation sealing material; and
a connecting terminal of the second bus bar is connected in direct contact with a connecting terminal of the first bus bar and protrudes from a surface of the insulation sealing material.

10. The power conversion apparatus according to claim 9, wherein:
the first bus bar is configured with a first positive side bus bar, a first negative side bus bar, and a first insulation member arranged between the first positive side bus bar and the first negative side bus bar;
the first positive side bus bar and the first negative side bus bar have a first positive bus bar flat portion and a first negative bus bar flat portion each of which is a widened flat portion, respectively, and the first positive bus bar flat portion and the first negative bus bar flat portion are stacked with the first insulation member in between;
the second bus bar is configured with a second positive side bus bar, a second negative side bus bar, and a second insulation member arranged between the second positive side bus bar and the second negative side bus bar; and
the second positive side bus bar and the second negative side bus bar have a second positive bus bar flat portion and a second negative bus bar flat portion each of which is a widened flat portion, respectively, and the second positive bus bar flat portion and the second negative bus bar flat portion are stacked with the second insulation member in between.

11. The power conversion apparatus according to claim 10, wherein the first bus bar includes a first terminal connected to a terminal extending from the U-phase power semiconductor module, a second terminal connected to a terminal extending from the V-phase power semiconductor module, a third terminal connected to a terminal extending from the W-phase power semiconductor module, and a fourth terminal connected to a connecting terminal of the second bus bar.

12. The power conversion apparatus according to claim 1, wherein the fourth terminal is formed in a shape protruding from an edge of the first bus bar.

13. The power conversion apparatus according to claim 1, wherein the first bus bar has a widened flat portion, and the width of the fourth terminal is formed to be narrower than the widened flat portion.

14. The power conversion apparatus according to claim 1, wherein the fourth terminal includes a fourth positive terminal and a fourth negative terminal, and a part of the fourth positive terminal faces to a part of the fourth negative terminal.

15. The power conversion apparatus according to claim 1, wherein the fourth terminal is formed at a tip of an upright portion extending upward from the first bus bar.

16. The power conversion apparatus according to claim 1, wherein the fourth terminal has a bending portion.

* * * * *